(12) United States Patent
Inoue et al.

(10) Patent No.: US 6,946,772 B2
(45) Date of Patent: Sep. 20, 2005

(54) SAW ELEMENT, SAW DEVICE AND BRANCHING FILTER

(75) Inventors: Kenji Inoue, Tokyo (JP); Masahiro Nakano, Tokyo (JP); Katsuo Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 113 days.

(21) Appl. No.: 10/436,438

(22) Filed: May 13, 2003

(65) Prior Publication Data

US 2004/0075362 A1 Apr. 22, 2004

(30) Foreign Application Priority Data

May 14, 2002 (JP) ........................................ 2002-138052

(51) Int. Cl.⁷ ................................................. H03H 9/25
(52) U.S. Cl. .................... 310/313 R; 333/189; 333/190
(58) Field of Search ...................... 310/313 R; 333/186, 333/189–193

(56) References Cited

U.S. PATENT DOCUMENTS

| | | | | |
|---|---|---|---|---|
| 5,909,156 A | * | 6/1999 | Nishihara et al. | ........... 333/193 |
| RE37,790 E | * | 7/2002 | Satoh et al. | ................ 333/193 |
| 6,480,077 B2 | * | 11/2002 | Ohashi | ....................... 333/193 |
| 6,522,219 B2 | * | 2/2003 | Takamiya et al. | ........... 333/133 |
| 6,552,631 B2 | * | 4/2003 | Huor | ........................... 333/195 |
| 6,566,981 B2 | * | 5/2003 | Urabe et al. | ................. 333/193 |
| 6,570,471 B2 | * | 5/2003 | Inoue et al. | ................. 333/195 |
| 2003/0006859 A1 | * | 1/2003 | Taniguchi | .................... 333/133 |

FOREIGN PATENT DOCUMENTS

| | | | | |
|---|---|---|---|---|
| JP | 5-183380 | | 7/1993 | ............ H03H/9/64 |
| JP | 6-69750 | * | 3/1994 | ............ H03H/9/64 |
| JP | 8-56136 | | 2/1996 | ............ H03H/9/64 |

* cited by examiner

*Primary Examiner*—Thomas M. Dougherty
(74) *Attorney, Agent, or Firm*—McGinn & Gibb, PLLC

(57) ABSTRACT

An SAW element 11 comprises a first wiring section 20 formed between an input terminal 18 and an output terminal 19, a plurality of first SAW resonators 15 which are located in serial to the first wiring section 20, a plurality of second SAW resonators 16 which are located in serial to the first wiring section 20 at the side of the input terminal 18 or at the side of the output terminal 19 with respect to the first SAW resonators 15, a plurality of second wiring section 22 which are formed between an intermediate point of the second SAW resonators 16 each other in the first wiring section 20 and a reference voltage electrode 21, and a plurality of third SAW resonators 17 which are located in the second wiring section 22, respectively, and which have anti-resonant frequencies corresponding with resonant frequencies of the second SAW resonators 16.

19 Claims, 6 Drawing Sheets

[Fig. 1]
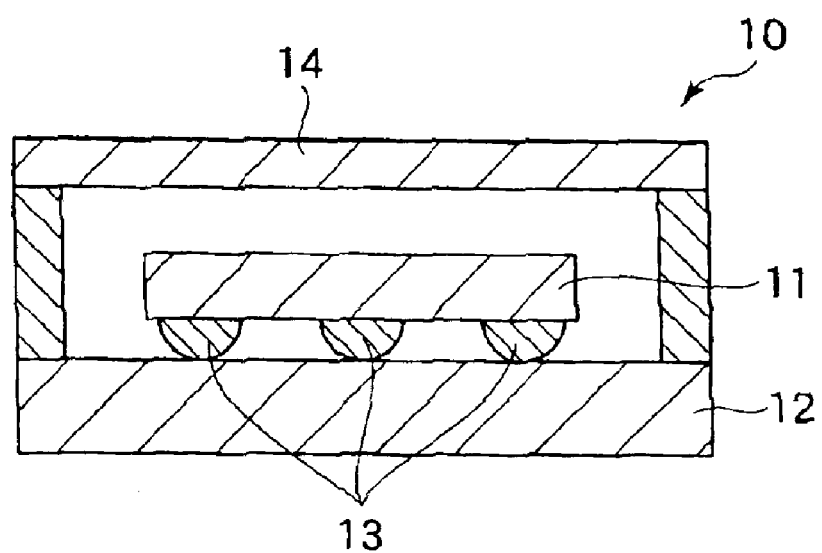

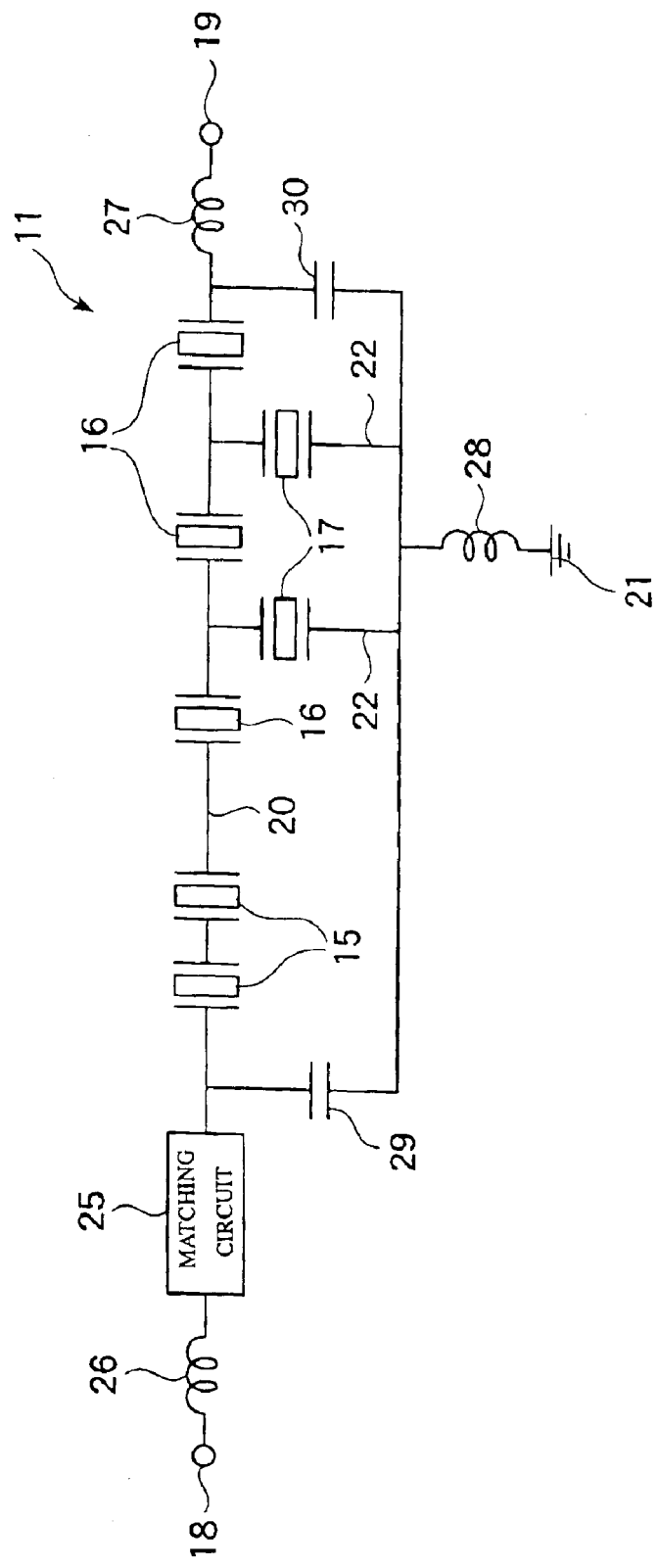
[Fig. 2]

[Fig. 3]
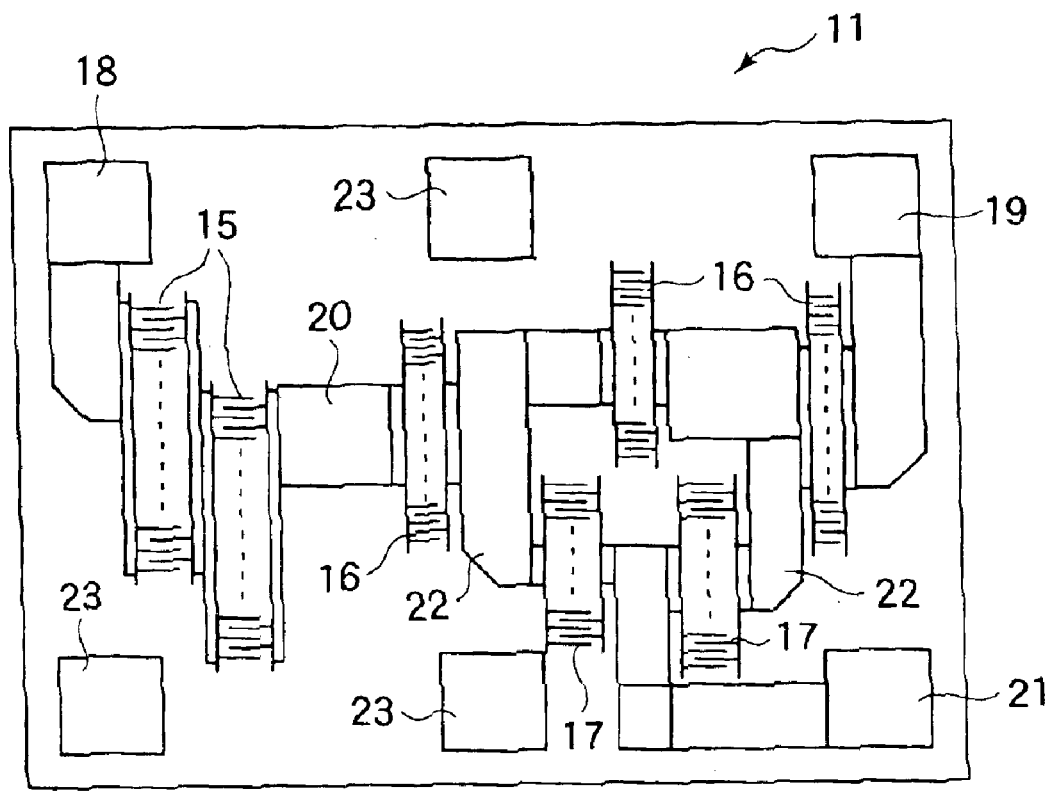
[Fig. 4]
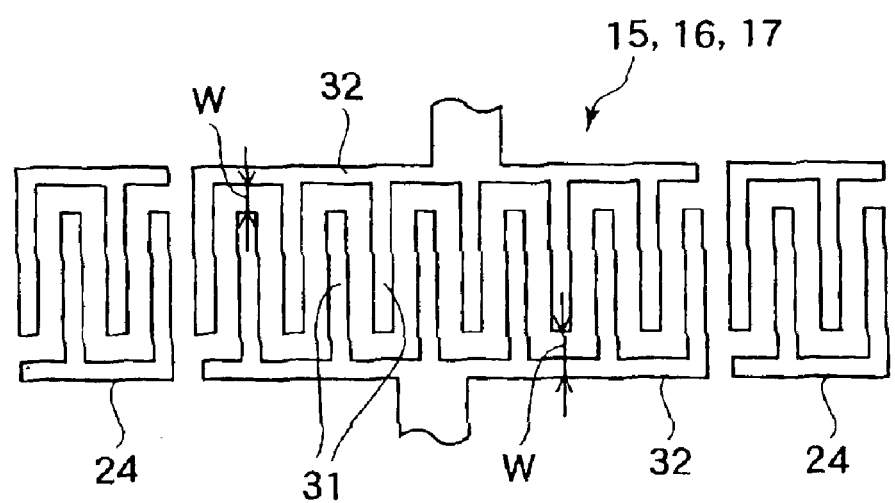

[Fig. 5]
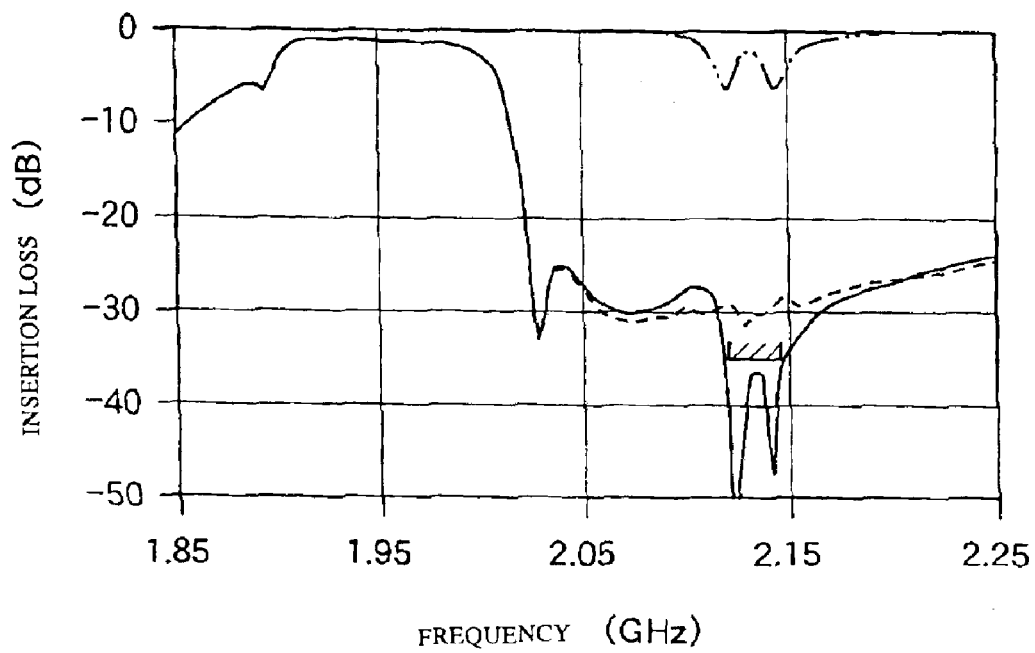
[Fig. 6]
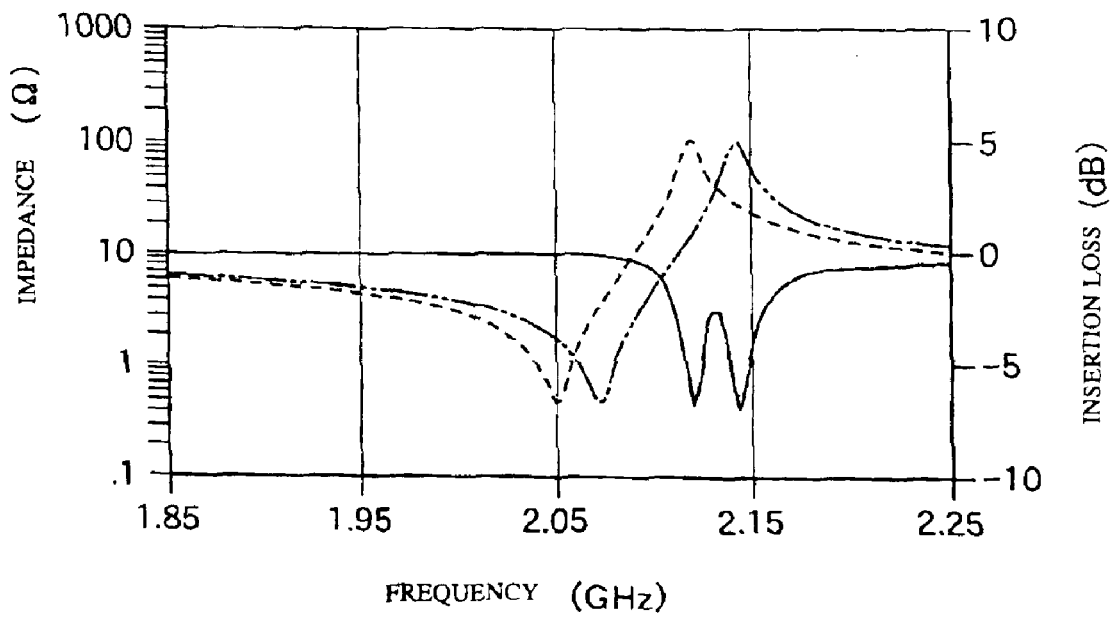

[Fig. 7]
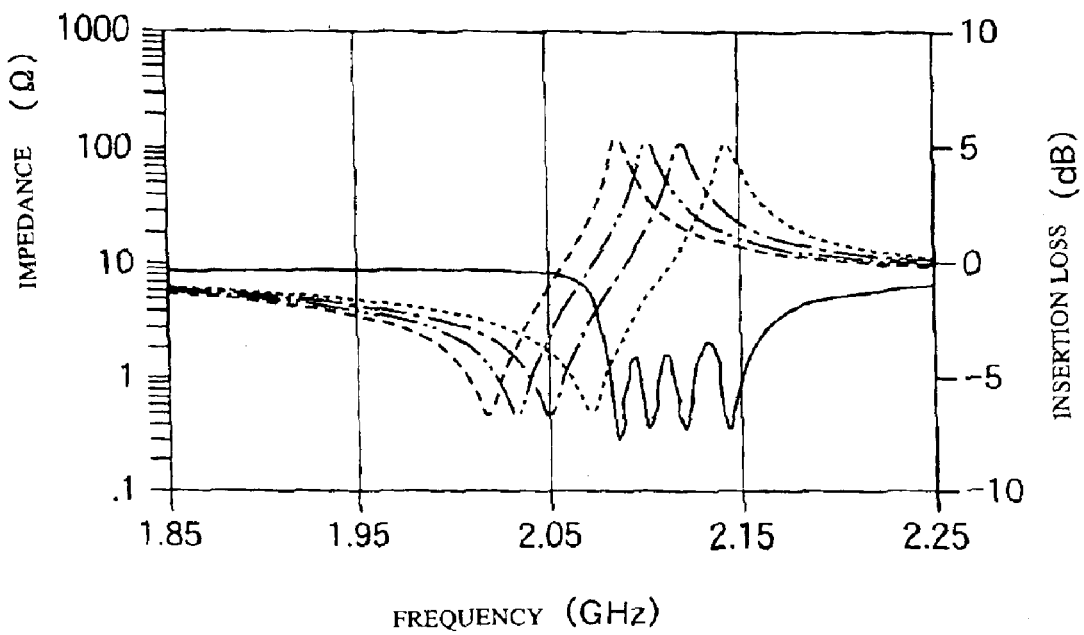
[Fig. 8]
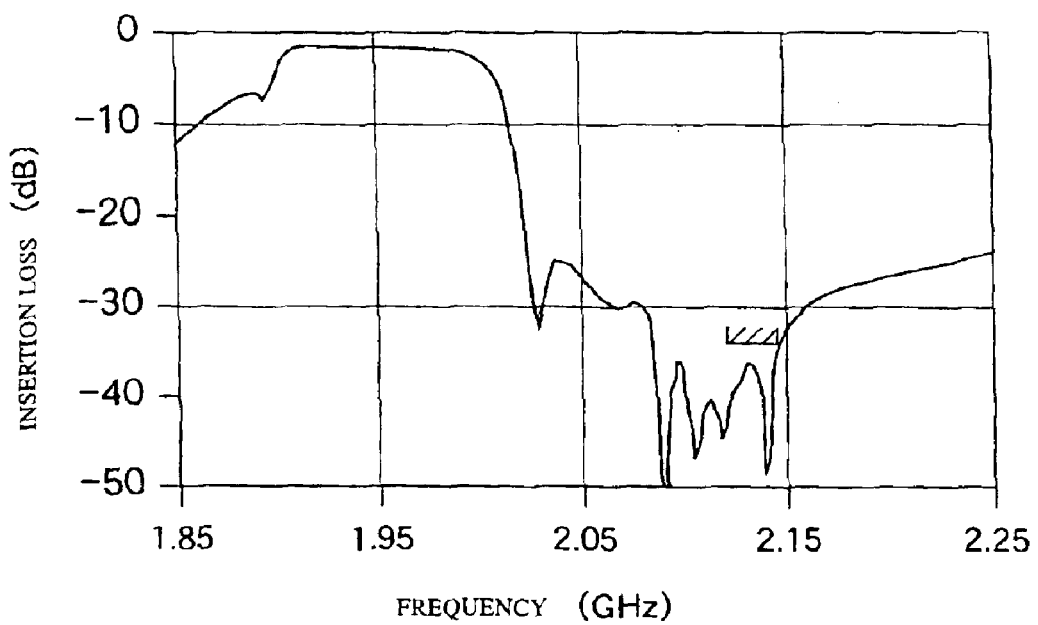

[Fig. 9]
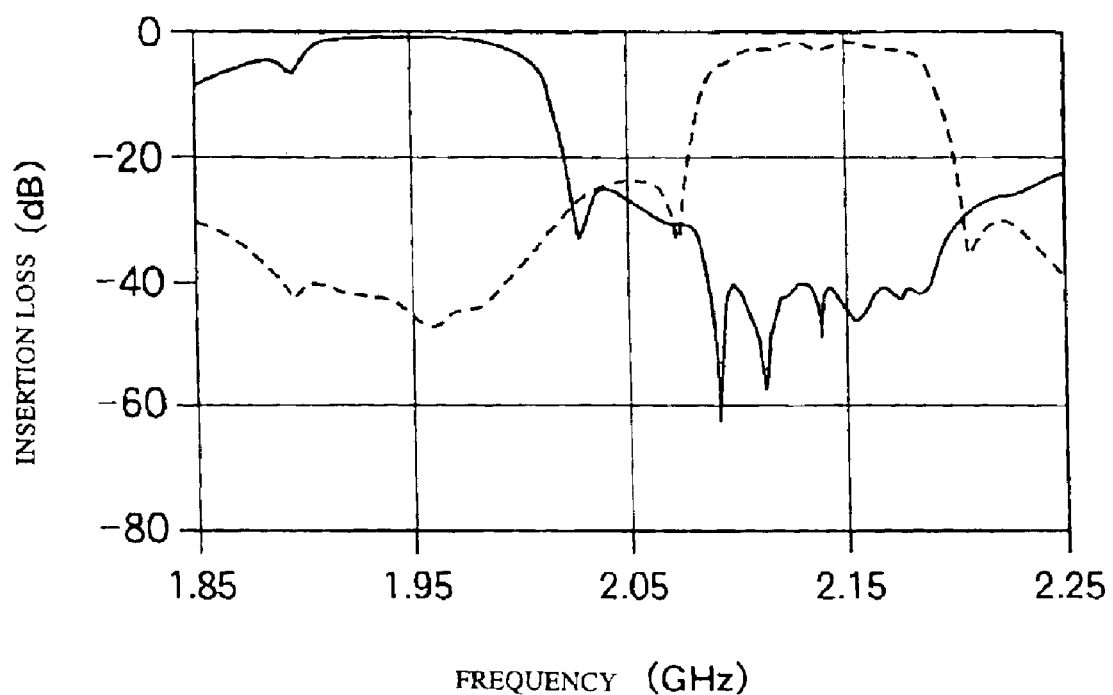

SAW ELEMENT, SAW DEVICE AND BRANCHING FILTER

TECHNICAL FIELD

The present invention relates to an SAW (Surface Acoustic Wave) element, an SAW device and a branching filter.

BACKGROUND ART

In recent years, mobile communication terminal equipment, such as a portable telephone, and the like has been rapidly progressed. From the viewpoint of convenience of portability or handiness, it is strongly desired that the mobile communication terminal equipment is not only small in size but also light in weight. In order to fabricate such small and light terminal equipment, it is essentially required that an electronic part or device used therein is also small in size and light in weight. Under the circumstances, many SAW devices each of which has advantage for being fabricated small and light, namely, many SAW filters have been used in a high-frequency section and an intermediate-frequency section of the terminal equipment.

An insertion loss and attenuation outside the pass band can be pointed out as important characteristics required for the SAW filter. Herein, the insertion loss influences power consumption of the mobile communication terminal equipment including the SAW filter. The insertion loss becomes lower, the life of a battery included in the mobile communication terminal equipment becomes longer. Therefore, a capacity of the battery can be reduced, dependent on the insertion loss. Accordingly, the mobile communication terminal equipment can be fabricated small in size and light in weight, when the insertion loss can be low. Further, when wide range attenuation outside the pass band can be obtained in an SAW filter, the mobile communication terminal equipment can also be fabricated small in size and light in weight.

As an SAW filter according to a first prior art, which complies with the characteristics of low insertion loss and high attenuation, there is such a RADA-type filter as disclosed in, for example, Japanese laid open Official Gazette No. Hei 5-183380. The RADA-type filter is such a circuit of multiple stages each composed of a SAW resonator connected to input/output electrodes in serial and another SAW resonator connected to the input/output electrodes in parallel. Plenty of the RADA-type filters have been used in a high-frequency filter of a portable telephone, since the RADA-type filters has excellent characteristics of low insertion loss and attenuation near the pass band thereof.

As an SAW filter according to a first prior art, which complies with the characteristics of low insertion loss and high attenuation, there is such a ladder-type filter as disclosed in, for example, Japanese laid open Official Gazette No. Hei 5-183380. The ladder-type filter is such a circuit of multiple stages each composed of a SAW resonator connected to input/output electrodes in serial and another SAW resonator connected to the input/output electrodes in parallel. Plenty of the ladder-type filters have been used in a high-frequency filter of a portable telephone, since the ladder-type filters has excellent characteristics of low insertion loss and attenuation near the pass band thereof.

The ladder-type filter has an excellent characteristic of the attenuation near the pass band. However, the ladder-type filter has a problem that an attenuation characteristic in a higher frequency region is rapidly deteriorated. Herein, attenuation can be obtained by using LC serial resonance caused by electrostatic capacity C of SAW resonators connected to each other in parallel and inductor component L included in a wiring from a ground electrode on an element to a reference voltage of a package. However, the attenuation characteristics are drastically deteriorated in a case that characteristics are deteriorated due to some reason by serial resistance component included in the wiring. It is therefore difficult to obtain stable attenuation characteristics.

Further, the notch-type filter is advantageous in attenuation characteristics at the higher frequency side of the pass band. However, the characteristics are attenuating smoothly at the lower frequency side of the pass band. The notch-type filter has a problem that band pass characteristics cannot be readily obtained. Further, in the notch-type filter, frequency of attenuation band is limited to anti-resonant frequency of a resonator. The notch-type filter cannot provide so much freedom of design.

Accordingly, it is an object of the present invention to solve these problems of the first and the second prior arts, and to provide an SAW element, an SAW device and a branching filter each having the characteristics of low insertion loss and high attenuation.

DISCLOSURE OF THE INVENTION

According to an aspect of the present invention, there is provided an SAW element comprising: a first wiring section formed between input and output terminals; a plurality of first SAW resonators which are located in serial to the first wiring section; a plurality of second SAW resonators which are located in serial to the first wiring section at the side of the input terminal or at the side of the output terminal with respect to the first SAW resonators; a plurality of second wiring section which are formed between an intermediate point of the second SAW resonators each other in the first wiring section and a reference voltage electrode; and a plurality of third SAW resonators which are located in the second wiring section, respectively, and which have anti-resonant frequencies corresponding with resonant frequencies of the second SAW resonators.

According to the invention thus described, the SAW element having characteristics of low insertion loss and high attenuation can be obtained by combining pass band characteristics of super low insertion loss and low attenuation achieved by the first SAW resonators with characteristics of low insertion loss and intermediate attenuation achieved by the second and the third SAW resonators.

Further, resonant frequencies of the first SAW resonators may be formed at a frequency band apart from pass band of the second and the third SAW resonators.

Besides, a piezoelectric substrate on which the first, the second and the third SAW resonators are formed may be made of $LiNbO_3$.

In addition, a piezoelectric substrate on which the first, the second and the third SAW resonators are formed may be made of $LiTaO_3$.

Further, a piezoelectric substrate on which the first SAW resonators are formed may be made of $LiNbO_3$ while a piezoelectric substrate on which the second and the third SAW resonators are formed may be made of $LiTaO_3$.

And, in the SAW element, ripple can be generated in an anti-resonant point.

According to another aspect of the present invention, there is provided an SAW device having a mounting substrate on which an SAW element is mounted, the SAW element comprising: a first wiring section formed between input and output terminals; a plurality of first SAW resonators which are located in serial to the first wiring section; a plurality of second SAW resonators which are located in serial to the first wiring section at the side of the input terminal or at the side of the output terminal with respect to the first SAW resonators; a plurality of second wiring section which are formed between an intermediate point of the second SAW resonators each other in the first wiring section and a reference voltage electrode; and a plurality of third SAW resonators which are located in the second wiring section, respectively, and which have anti-resonant frequencies corresponding with resonant frequencies of the second SAW resonators.

Besides, the SAW element may be mounted on the mounting substrate in a manner that an element-forming surface of a piezoelectric substrate on which the first, the second and the third SAW resonators are formed is opposite to a mounting surface of the mounting substrate.

According to yet another aspect of the present invention, there is provided a branching filter including two SAW elements of which center frequencies of pass bands are different from each other, any one of the SAW elements comprising: a first wiring section formed between input and output terminals; a plurality of first SAW resonators which are located in serial to the first wiring section; a plurality of second SAW resonators which are located in serial to the first wiring section at the side of the input terminal or at the side of the output terminal with respect to the first SAW resonators; a plurality of second wiring section which are formed between an intermediate point of the second SAW resonators each other in the first wiring section and a reference voltage electrode; and a plurality of third SAW resonators which are located in the second wiring section, respectively, and which have anti-resonant frequencies corresponding with resonant frequencies of the second SAW resonators.

BRIEF DESCRIPTION OF THE DRAWINGS

FIG. 1 is a sectional view for showing an SAW device in which an SAW element is packaged according to an embodiment of the present invention;

FIG. 2 is a circuit diagram for showing an equal circuit of the SAW element according to the embodiment of the present invention;

FIG. 3 is a schematic view for showing an arrangement of elements formed on an element-forming surface of a piezoelectric substrate in the SAW element according to the embodiment of the present invention;

FIG. 4 is a plan view for showing a pattern of SAW resonators in the SAW element illustrated in FIG. 3;

FIG. 5 is a graph for showing a pass band characteristic of the SAW element according to the embodiment of the present invention;

FIG. 6 is a graph for showing impedance characteristics of first SAW resonators, respectively, and a pass band characteristic thereof in a case that the first SAW resonators are connected to each other;

FIG. 7 is a graph for showing an impedance characteristic of each stage of the first SAW resonators in a case that the first SAW resonators are constructed by four stages, and a pass band characteristic of the first SAW resonators;

FIG. 8 is a graph for showing a frequency characteristic of the SAW element in which the first SAW resonators having characteristics illustrated in FIG. 7 are used; and FIG. 9 is a graph for showing a frequency characteristic of a branching filter in which the SAW element according to the embodiment of the present invention is used.

BEST EMBODIMENT FOR CARRYING OUT THE INVENTION

Now, referring to the drawings, an embodiment of the present invention will be described more concretely. Herein, the same members are designated by the same reference numerals in the attached drawings. Further, overlapped description will be omitted. Besides, the embodiment of the invention is a particularly useful embodiment for carrying out the present invention. The present invention is therefore not restricted to the embodiment.

FIG. 1 is a sectional view for showing an SAW device in which an SAW element is packaged according to an embodiment of the present invention. FIG. 2 is a circuit diagram for showing an equal circuit of the SAW element according to the embodiment of the present invention. FIG. 3 is a schematic view for showing an arrangement of elements formed on an element-forming surface of a piezoelectric substrate in the SAW element according to the embodiment of the present invention. FIG. 4 is a plan view for showing a pattern of SAW resonators in the SAW element illustrated in FIG. 3. FIG. 5 is a graph for showing a pass band characteristic of the SAW element according to the embodiment of the present invention. FIG. 6 is a graph for showing impedance characteristics of first SAW resonators, respectively, and a pass band characteristic thereof in a case that the first SAW resonators are connected to each other. FIG. 7 is a graph for showing an impedance characteristic of each stage of the first SAW resonators in a case that the first SAW resonators are constructed by four stages, and a pass band characteristic of the first SAW resonators. FIG. 8 is a graph for showing a frequency characteristic of the SAW element in which the first SAW resonators having characteristics illustrated in FIG. 7 are used. FIG. 9 is a graph for showing a frequency characteristic of a branching filter in which the SAW element according to the embodiment of the present invention is used.

The SAW device 10 illustrated in FIG. 1 comprises the SAW element 11 which is mounted on a mounting substrate 12. The SAW element 11 has a predetermined conductive pattern formed on a piezoelectric substrate. Predetermined wiring pattern and circuit pattern which are composed of one or a plurality of layers are formed in the mounting substrate 12. The mounting substrate 12 is made of ceramics or resin. Further, an element-forming surface of the SAW element 11 is located to be opposite to a mounting surface of the mounting substrate 12. The SAW element 11 and the mounting substrate 12 are connected to each other by flip-chip bonding through bumps 13. Alternatively, the SAW element 11 and the mounting substrate 12 may be wirily connected to each other by wire bonding technique.

Herein, the piezoelectric substrate is made of piezoelectric monocrystal such as $LiNbO_3$, $LiTaO_3$, or crystalline quartz, or piezoelectric ceramics such as lead zirconate titanate based piezoelectric ceramics. But, there may be employed a piezoelectric substrate in which a piezoelectric thin film such as ZnO thin film is formed on an insulating substrate.

Further, a cap 14 is adhered to the mounting substrate 12 with the SAW element 11 being surrounded by the cap 14. The SAW element 11 is thereby protected from dust, mechanical impact, and the like.

On the piezoelectric substrate (for example, a piezoelectric substrate of 39° rotated, Y cut, X propagation $LiTaO_3$) of the SAW element 11, as illustrated in FIGS. 2 and 3, the SAW resonators 15, 16 and 17 each resonating with surface acoustic wave of a predetermined frequency are formed on the mounting surface thereof.

As illustrated in the drawing, a first wiring section 20 is formed between an input electrode 18 and an output electrode 19 through which electric signals are inputted, outputted, respectively. Two first SAW resonators 15 are located in serial to each other in the first wiring section 20. Further, in the first wiring section 20, three second SAW resonators 16 are located in serial to each other at the side of the output electrode 19 with respect to the first SAW resonators 15.

Further, two second wiring sections 22 are formed between intermediate points of respective adjacent second SAW resonators 16 in the first wiring section 20 and a reference voltage electrode 21. In addition, third SAW resonators 17 each of which has an anti-resonant frequency corresponding with the resonant frequency of the second SAW resonator 16 are located in respective second wiring sections 22.

Moreover, three dummy electrodes 23 are formed on the piezoelectric substrate in addition to the above-mentioned input electrode 18, the output electrode 19 and the reference voltage electrode 21. Further, a matching circuit 25 which keeps a matching with an inputted load is formed between the input terminal 18 and the first SAW resonators 15.

Besides, in FIG. 2, reference numerals 26, 27 and 28 represent inductance components included in wirings drawn around in the first and the second wiring sections 20 and 22. Reference numerals 29 and 30 represent capacitance components generated between the first wiring section 20 as a signal line and the reference voltage electrode 21. However, these components 26, 27, 28, 29 and 30 are such ones as indicating representative parasitic effect components inevitably included in an actual constitution as elements. Other parasitic effect elements may be added thereto.

Herein, "anti-resonant frequency corresponding with the resonant frequency" in this specification does not require that the both frequencies are strictly corresponding with each other. It is enough that the both frequencies are corresponding with each other to perform a predetermined function, such as a function of a filter, and the like.

Besides, it is enough that a plurality of the first SAW resonators 15, a plurality of the second SAW resonators 16, a plurality of the third SAW resonators 17 and a plurality of the second wiring sections are formed, respectively. The numbers of those are not limited to the illustrated numbers. Further, in the present embodiment, the first SAW resonators 15 are located at the side of the input terminal 18 while the second SAW resonators 16 are located at the side of the output terminal 19. However, the first SAW resonators 15 may be located at the side of the output terminal 19 while the second SAW resonators 16 may be located at the side of the input terminal 18.

The bumps 13 illustrated in FIG. 1 are formed on the electrodes 18, 19, 21 and 23. The electrodes 18, 19, 21 and 23 are connected to the mounting substrate 12 through the bumps by ultrasonic waves. Accordingly, by the bump connection thus mentioned, the element-forming surface is located to be opposite to the mounting surface of the mounting substrate 12, as mentioned before.

Herein, the SAW resonators 15, 16 and 17 are comprised of an inter-digital transducer (IDT) having a number of pair of electrode fingers, which is disposed between two reflectors, as illustrated in FIG. 4. Accordingly, when voltage is applied to such electrodes having a shape of teeth of combs at the input side to generate an electric field, a surface acoustic wave is generated on the piezoelectric substrate by a piezoelectric effect. Further, a mechanical distortion due to the thus generated surface acoustic wave generates an electric field, which is converted into an electric signal at the output side thereof. Besides, frequency characteristics of the SAW resonators 15, 16 and 17 can be varied by changing conditions, such as aperture length of the IDT numbers of pairs of electrodes, or the like.

Besides, reflectors 24 for reflecting surface acoustic waves are located on both sides of the SAW resonators 15, 16 and 17.

Next, description will proceed to a frequency characteristic of the SAW element 11 according to the present embodiment.

In FIG. 5, depicted is a pass band characteristic of the SAW element 11 according to the present embodiment.

In FIG. 5, the continuous line shows a pass band characteristic by the SAW element according to the present embodiment, the two-dot chain line shows a pass band characteristic only by the first SAW resonators 15, the broken line shows a pass band characteristic by the second and the third SAW resonators 16 and 17, respectively.

As illustrated in the drawing, it will be understood that a deep attenuation can be obtained around 2.14 GHz in the SAW element according to the present embodiment. Namely, a larger attenuation can be obtained by the SAW element of the present embodiment than that obtained by the second and the third SAW resonators 16 and 17 at the higher frequency side apart from the pass band. A larger attenuation can be obtained by the SAW element of the present embodiment than that obtained only by the first SAW resonators 15 at the lower frequency side of the pass band. Further, insertion loss in the pass band by the SAW element of the present embodiment is equal to that by the second and the third SAW resonators 16 and 17.

Therefore, according to the present embodiment, the SAW element 11 having characteristics of low insertion loss and high attenuation can be obtained by combining pass band characteristics of super low insertion loss and low attenuation achieved by the first SAW resonators 15 with characteristics of low insertion loss and intermediate attenuation achieved by the second and the third SAW resonators 16 and 17.

Next, description will proceed to the first SAW resonators 15.

As mentioned before, the first SAW resonators 15 are composed of two (two stages of) SAW resonators of which pitches of the electrodes having a shape of teeth of combs are different from each other.

Herein, in FIG. 6, depicted are impedance characteristics of each stage of SAW resonator of the first SAW resonators 15, respectively, and a pass band characteristic thereof, in a case that each stage of the SAW resonator is connected to each other. Besides, the continuous line shows a pass band characteristic of the first SAW resonators 15, the broken line, and the two-dot chain line show impedance characteristics of first and second stages of the SAW resonators, respectively.

As illustrated in the drawing, it will be understood that anti-resonant frequencies of the first and the second stages of the SAW resonators correspond with attenuation poles of the pass band characteristic of the first SAW resonators 15. Further, it will also be understood that resonant frequencies of each stage of the SAW resonators are sufficiently larger than the pass band of the SAW element of the present embodiment illustrated in FIG. 5. Namely, it will be understood that the first SAW resonators 15 have resonant frequencies not in around the higher frequency side of the pass band of the second and the third SAW resonators 16 and 17 but in frequency band apart from the pass band thereof Accordingly, the first SAW resonators 15 have thereby an attenuation band larger than that by the second and the third SAW resonators 16 and 17 in the frequency band apart from the pass band.

Besides, the SAW element constructed only by the first SAW resonators has a pass band around the resonant frequencies of the first SAW resonators. On the other hand, it is a feature of the SAW element of the present embodiment that the pass band thereof is formed in sufficiently lower frequency side than the resonant frequencies thereof.

Further, in the SAW element constructed only by the first SAW resonators, a high attenuation is achieved by forming capacitance component using permittivity of a piezoelectric substrate between the signal line and the reference voltage. On the other hand, such attenuation by capacitance component is not required in the SAW element of the present embodiment. A mounting manner by flip-chip structure in which an element-forming surface of a piezoelectric substrate is opposite to a mounting surface of the mounting substrate therefore becomes preferable. It thereby becomes possible that the SAW device is rendered to be small both in thickness and in height.

Besides, the following advantages are generated by flip-chip mounting of the present SAW element.

Namely, since the permittivity $\epsilon$ of a piezoelectric substrate is about 40 (LT), the permittivity becomes an important factor of capacitance in a face-up bonding (wire bonding). Thereby, floating capacitance is inevitably constituted in the second wiring section. Accordingly, by this floating capacitance, an attenuation band is, in some cases, constructed at the lower frequency side of the resonant frequencies of the SAW resonator. On the other hand, a flip-chip mounting can get rid of the floating capacitance.

Concretely, an air gap of permittivity 1 corresponding to, for example, a thickness of a piezoelectric substrate of 350 $\mu$m, permittivity 40 (LT) is 350/40=9 $\mu$m. The flip-chip mounting can reduce the floating capacitance by forming height of bumps after mounting higher than that of 9 $\mu$m.

Thereby, even though the first SAW resonators 15 and the second SAW resonators 16 are multistage connected to the first wiring section 20 in serial to each other to form a large area resonator, inconvenience caused by the floating parallel capacitance can be avoided.

Herein, impedance characteristics of each stage of SAW resonator of the first SAW resonators 15 at the lower frequency region than the resonant frequencies can be substantially represented only by capacitance between electrode fingers. Accordingly, an electrostatic capacitance of the SAW resonator is determined by numbers of pairs of electrodes ×transposition width thereof, in a case that pitches of a piezoelectric substrate and the electrode fingers are the same as each other. In the present embodiment, numbers of pairs of electrodes×transposition width of the first SAW resonators 15 is adequately determined in order that a matching of a pass band of the SAW element 11 is changed into a capacitive one with the matching of the pass band of the SAW element 11 being kept at 50Ω. Consequently, a matching is readily matched with 50Ω merely by connecting a matching circuit 25 composed of inductors in serial.

Herein, description will proceed to means for enlarging a band width of attenuation band.

Anti-resonant frequency point can be obtained at a desirable frequency to form the attenuation band by adjusting pitches of cross finger electrodes of each stage of SAW resonators in the first SAW resonators 15. Consequently, the band width of the attenuation band can be enlarged not only by increasing number of the stages of the first SAW resonators 15 but also by making the pitches of the cross finger electrodes different from each other in each stage of the SAW resonators. Besides, in a case that difference of the pitches of the cross finger electrodes in each stage of the SAW resonators becomes large, ripple is generated between anti-resonant frequencies of each stage of the SAW resonators. It is therefore necessary to select adequate difference of the pitches for preventing the ripple from being generated.

FIG. 7 shows an impedance characteristic of each stage of the first SAW resonators 15 in a case that the first SAW resonators are constructed by four stages, and a pass band characteristic of the first SAW resonators 15. FIG. 8 shows a frequency characteristic of the SAW element in which such first SAW resonators 15 are used.

As will be understood from these drawings, the number of stages of SAW resonators constituting first SAW resonators 15 becomes more, the band width of attenuation band is more enlarged.

In the interim, as mentioned before, in the SAW element of the present embodiment, the resonant frequency of the first SAW resonators 15 can be formed at a frequency band apart from the pass band of the second and the third SAW resonators 16 and 17.

Accordingly, description will next proceed to a case in which such an SAW element is applied to a filter of a branching filter, that is, one of SAW devices. A branching filter is constituted by connecting two filters of which center frequencies of pass bands are different from each other in parallel with respect to a terminal. A center frequency of a pass band of one filter of the branching filter is formed at the lower frequency side while a center frequency of a pass band of another filter thereof is formed at the higher frequency side. Such a branching filter is used, for example, by connecting the above-described terminal to an antenna, connecting an opposite end of the above-described filter at the lower frequency side to a transmission apparatus, and connecting an opposite end of the above-described another filter at the higher frequency side to a receiver apparatus. In the branching filter thus described, let the SAW element of this embodiment be used as the filter at the lower frequency side. Accordingly, a signal at the higher frequency side can be so far attenuated in output of the filter at the lower frequency side. The use of the SAW element of this embodiment can therefore realize a branching filter capable of so far reducing input of unnecessary signals from the transmission apparatus into the receiver apparatus.

FIG. 9 shows frequency characteristics of a branching filter in which the SAW element of this embodiment is applied to the filter at the lower frequency side (continuous line) and in which a known ladder-type filter is applied to the filter at the higher frequency side (broken line).

As illustrated in the drawings, according to such a branching filter, a sufficient attenuation can be obtained at the pass band of the filter of the opposite frequency side. Further, it becomes unnecessary to prepare a matching circuit by inductors connected in serial to each other, although it is required in a case only by SAW element.

Herein, let LiNbO$_3$ of 41° rotated Y cut, X propagation of which propagation loss is larger than that of LiTaO$_3$ be used as the piezoelectric substrate. Consequently, anti-resonant point has become dull, so that smoother attenuation band can be obtained. Accordingly, ripple having an influence within the pass band of the filter of the opposite frequency side can be reduced by using such an SAW element as a branching filter.

Besides, not only the smooth attenuation band can be obtained but also the ripple in the pass band of the filter of the opposite frequency side can be reduced in the above-described method. However, insertion loss of the filter at the lower frequency side is sometimes increased. When the insertion loss cannot be a sacrifice, the first SAW resonators 15 may be formed on LiNbO$_3$ while the second and the third SAW resonators 16 and 17 may be formed on LiTaO$_3$. Thereby, without a sacrifice of the insertion loss, the smooth attenuation band can be obtained and the ripple in the pass band of the filter of the opposite frequency side can be reduced.

Further, in order to make the anti-resonant point dull, it is enough to make the ripple be generated in the anti-resonant point. This is achieved by adjusting a space W between each electrode finger 31 and a bus bar 32 in FIG. 4.

Hereunder, description will proceed to a generation of ripple in a case that an SAW element is formed on the piezoelectric substrate of 39° rotated Y cut, X propagation LiTaO$_3$.

Let two SAW resonators constituting the first SAW resonators 15 have 260 pairs of electrode fingers 31, 34 λ of an aperture length of the electrode fingers, 3.0 λ of a space between each electrode finger 31 and a bus bar 32, and let the reflector 24 have 100 electrode fingers (See FIG. 4). Under these conditions, let the anti-resonant frequency of each stage of SAW resonator be shifted by changing pitches of the electrode fingers 31. Besides, λ is a wavelength of a surface acoustic wave. Accordingly, the ripple is generated in the anti-resonant point, so that the anti-resonant point substantially becomes dull. Therefore, a smoother attenuation band can be obtained similarly.

Further, there are another means for obtaining a smooth attenuation band and reducing the ripple in the pass band of the filter of the opposite frequency side. Namely, let each stage of the SAW resonator in the first SAW resonators 15 have a constitution in which two kinds of the pitches of the electrode fingers 31 are combined. Thereby, two kinds of the resonant frequencies and two kinds of the anti-resonant frequencies can be obtained in each stage of the SAW resonator. Accordingly, an instance between the anti-resonant frequencies in each stage of the SAW resonator can be enlarged. Consequently, a broad and smooth attenuation band can be obtained.

Besides, application fields of the present invention are not limited to a filter. In addition to a field of the filter, the present invention can be applied to various SAW devices on which one or pluralities of SAW elements are mounted.

Possibility of Industrial Use

As will be clear from the explanation thus mentioned, according to the present invention, the SAW element having characteristics of low insertion loss and high attenuation can be obtained by combining pass band characteristics of super low insertion loss and low attenuation achieved by the first SAW resonators with characteristics of low insertion loss and intermediate attenuation achieved by the second and the third SAW resonators.

In addition, when the resonant frequency of the first SAW resonators is established in a frequency band apart from the pass band of the second and the third SAW resonators, a large attenuation band can be established in a frequency band apart from the pass band.

Further, when a piezoelectric substrate on which the first, the second and the third SAW resonators are formed is made of LiNbO$_3$, propagation loss is large and therefore anti-resonant point becomes dull. Consequently, smoother attenuation band can be obtained.

And, when a piezoelectric substrate on which the first SAW resonators are formed is made of LiNbO$_3$ while a piezoelectric substrate on which the second and the third SAW resonators are formed is made of LiTaO3, the smooth attenuation band can be obtained and the ripple in the pass band of the filter of the opposite frequency side can be reduced without a sacrifice of the insertion loss.

Further, by making the ripple be generated in the anti-resonant point, the anti-resonant point becomes dull due to the ripple. Therefore, a smoother attenuation band can be obtained.

Further, let the SAW element be mounted on a mounting substrate in a manner that an element-forming surface of a piezoelectric substrate on which the first, the second and the third SAW resonators are formed is opposite to a mounting surface of the mounting substrate. Accordingly, attenuation by capacitance component is not required in the SAW element. It thereby becomes possible that the SAW device is rendered to be small both in thickness and in height.

Furthermore, let a branching filter be constituted by an SAW device that includes two SAW elements of which center frequencies of pass bands are different from each other and that one of the two SAW elements is the SAW element mentioned before. Accordingly, a sufficient attenuation can be obtained at the pass band of the filter of the opposite frequency side. In addition, it becomes unnecessary to prepare a matching circuit by inductors connected in serial to each other, although it is required in a case only by SAW element.

What is claimed is:

1. A surface acoustic wave (SAW) element comprising:
   a first wiring section formed between input and output terminals;
   a plurality of first SAW resonators which are located in series with said first wiring section;
   a plurality of second SAW resonators which are located in series with said first wiring section at a side of said input terminal or at a side of said output terminal with respect to said first SAW resonators;
   a plurality of second wiring sections which are respectively formed between an intermediate point of adjacent pairs of said second SAW resonators in said first wiring section and a reference voltage electrode; and
   a plurality of third SAW resonators which are respectively located in said second wiring sections and which have anti-resonant frequencies corresponding with resonant frequencies of said second SAW resonators.

2. An SAW element as claimed in claim 1, wherein resonant frequencies of said first SAW resonators are formed at a frequency band apart from a pass band of said second and said third SAW resonators.

3. An SAW element as claimed in claim 1, wherein a piezoelectric substrate on which said first, said second and said third SAW resonators are formed comprises LiNbO$_3$.

4. An SAW element as claimed in claim 1, wherein a piezoelectric substrate on which said first, said second and said third SAW resonators are formed comprises LiTaO$_3$.

5. An SAW element as claimed in claim 1, wherein a piezoelectric substrate on which said first SAW resonators are formed comprises LiNbO$_3$, while a piezoelectric substrate on which said second and said third SAW resonators are formed comprises LiTaO$_3$.

6. An SAW element as claimed in claim 1, wherein a ripple is generated in an anti-resonant point.

7. A surface acoustic wave (SAW) device having a mounting substrate on which an SAW element is mounted, said SAW element comprising:
- a first wiring section formed between input and output terminals;
- a plurality of first SAW resonators which are located in series with said first wiring section;
- a plurality of second SAW resonators which are located in series with said first wiring section at a side of said input terminal or at a side of said output terminal with respect to said first SAW resonators;
- a plurality of second wiring sections which are respectively formed between an intermediate point of adjacent pairs of said second SAW resonators in said first wiring section and a reference voltage electrode; and
- a plurality of third SAW resonators which are respectively located in said second wiring sections and which have anti-resonant frequencies corresponding with resonant frequencies of said second SAW resonators.

8. An SAW device as claimed in claim 7, wherein resonant frequencies of said first SAW resonators are formed at a frequency band apart from a pass band of said second and said third SAW resonators.

9. An SAW device as claimed in claim 7, wherein a piezoelectric substrate on which said first, said second and said third SAW resonators are formed comprises $LiNbO_3$.

10. An SAW device as claimed in claim 7, wherein a piezoelectric substrate on which said first, said second and said third SAW resonators are formed comprises $LiTaO_3$.

11. An SAW device as claimed in claim 7, wherein a piezoelectric substrate on which said first SAW resonators are formed comprises $LiNbO_3$, while a piezoelectric substrate on which said second and said third SAW resonators are formed comprises $LiTaO_3$.

12. An SAW device as claimed in claim 7, wherein a ripple is generated in an anti-resonant point.

13. An SAW device as claimed in claim 7, wherein said SAW element is mounted on said mounting substrate in a manner that an element-forming surface of a piezoelectric substrate on which said first, said second and said third SAW resonators are formed is opposite to a mounting surface of said mounting substrate.

14. A branching filter including two surface acoustic wave (SAW) elements of which center frequencies of pass bands are different from each other, any one of said SAW elements comprising:
- a first wiring section formed between input and output terminals;
- a plurality of first SAW resonators which are located in series with said first wiring section;
- a plurality of second SAW resonators which are located in series with said first wiring section at a side of said input terminal or at a side of said output terminal with respect to said first SAW resonators;
- a plurality of second wiring sections which are respectively formed between an intermediate point of adjacent pairs of said second SAW resonators in said first wiring section and a reference voltage electrode; and
- a plurality of third SAW resonators which are respectively located in said second wiring sections and which have anti-resonant frequencies corresponding with resonant frequencies of said second SAW resonators.

15. A branching filter as claimed in claim 14, wherein resonant frequencies of said first SAW resonators are formed at a frequency band apart from a pass band of said second and said third SAW resonators.

16. A branching filter as claimed in claim 14, wherein a piezoelectric substrate on which said first, said second and said third SAW resonators are formed comprises $LiNbO_3$.

17. A branching filter as claimed in claim 14, wherein a piezoelectric substrate on which said first, said second and said third SAW resonators are formed comprises $LiTaO_3$.

18. A branching filter as claimed in claim 14, wherein a piezoelectric substrate on which said first SAW resonators are formed comprises $LiNbO_3$, while a piezoelectric substrate on which said second and said third SAW resonators are formed comprises $LiTaO_3$.

19. A branching filter as claimed in claim 14, wherein a ripple is generated in an anti-resonant point.

* * * * *